United States Patent
Seto

(10) Patent No.: US 11,430,827 B2
(45) Date of Patent: Aug. 30, 2022

(54) PHOTOELECTRIC CONVERSION APPARATUS AND CAMERA

(71) Applicant: CANON KABUSHIKI KAISHA, Tokyo (JP)

(72) Inventor: Daichi Seto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 222 days.

(21) Appl. No.: 16/722,850

(22) Filed: Dec. 20, 2019

(65) Prior Publication Data

US 2020/0219926 A1 Jul. 9, 2020

(30) Foreign Application Priority Data

Jan. 8, 2019 (JP) .............................. JP2019-001378

(51) Int. Cl.
*H01L 27/14* (2006.01)
*H01L 27/146* (2006.01)

(52) U.S. Cl.
CPC .. *H01L 27/14643* (2013.01); *H01L 27/14605* (2013.01); *H01L 27/14612* (2013.01); *H01L 27/14636* (2013.01)

(58) Field of Classification Search
CPC ......... H01L 27/14643; H01L 27/14612; H01L 27/14605; H01L 27/14636
See application file for complete search history.

(56) References Cited

U.S. PATENT DOCUMENTS

| 2007/0210395 A1 | 9/2007 | Maruyama et al. |
| 2017/0323912 A1* | 11/2017 | Lahav ............... H01L 27/14623 |
| 2018/0374886 A1 | 12/2018 | Iwata et al. |
| 2019/0259801 A1 | 8/2019 | Seto et al. |

FOREIGN PATENT DOCUMENTS

| JP | H10-112535 A | 4/1998 |
| JP | 2009-059847 A | 3/2009 |

OTHER PUBLICATIONS

U.S. Appl. No. 16/601,888, filed Oct. 15, 2019 (First Named Inventor: Sho Suzuki).

* cited by examiner

*Primary Examiner* — Tony Ko
(74) *Attorney, Agent, or Firm* — Venable LLP

(57) ABSTRACT

A photoelectric conversion apparatus is provided. The apparatus comprises a photoelectric conversion portion including a first region of a first conductivity type arranged on the side of a front surface of a substrate, a floating diffusion of the first conductivity type to which charges generated in the photoelectric conversion portion are transferred, and a charge transfer portion arranged between the photoelectric conversion portion and the floating diffusion, a transfer gate electrode arranged on the charge transfer portion and a potential control electrode arranged on the photoelectric conversion portion to control a potential in the first region. The potential control electrode is arranged spaced apart from the transfer gate electrode, and a voltage set in a direction in which the potential will increase with respect to the charges is applied to the potential control electrode when charges are to be transferred.

16 Claims, 7 Drawing Sheets

PHOTOELECTRIC CONVERSION APPARATUS AND CAMERA

BACKGROUND OF THE INVENTION

Field of the Invention

The present invention relates to a photoelectric conversion apparatus and a camera.

Description of the Related Art

In a photoelectric conversion apparatus, a photodiode that uses a p-n junction between a p-type semiconductor region and an n-type semiconductor region which functions as a charge accumulation region is widely used as a photoelectric conversion portion that generates charges corresponding to incident light. In a case in which the potential inside the charge accumulation region is deepened to increase the saturated charge amount of the photoelectric conversion portion, the charge transfer performance will degrade because the potential difference between the charge accumulation region and a floating diffusion to which the charges are transferred will decrease. Japanese Patent Laid-Open No. 10-112535 discloses that a potential adjustment electrode is arranged on a photodiode to apply a negative voltage to the photodiode from the potential adjustment electrode when charges are to be transferred so that the potential inside the photodiode can be reduced to improve the charge transfer performance.

SUMMARY OF THE INVENTION

In the structure shown in Japanese Patent Laid-Open No. 10-112535, a part of the potential adjustment electrode is arranged so as to overlap a channel region for transferring the charges. When the charges are to be transferred, there is a possibility that a potential barrier will be formed in the region where the channel region and the potential adjustment electrode overlap due to the negative voltage applied from the potential adjustment electrode. The charge transfer performance will degrade if a potential barrier is formed in the channel region.

Some of the embodiments of the present invention provide a technique advantageous in achieving a large saturated charge amount and a high charge transfer performance.

According to some embodiments, a photoelectric conversion apparatus comprising: a photoelectric conversion portion including a first region of a first conductivity type arranged on the side of a front surface of a substrate, a floating diffusion of the first conductivity type to which charges generated in the photoelectric conversion portion are transferred, and a charge transfer portion arranged between the photoelectric conversion portion and the floating diffusion; a transfer gate electrode arranged on the charge transfer portion; and a potential control electrode arranged on the photoelectric conversion portion to control a potential in the first region, wherein in an orthogonal projection with respect to the front surface, the potential control electrode is arranged spaced apart from the transfer gate electrode, and a voltage set in a direction in which the potential will increase with respect to the charges is applied to the potential control electrode when charges are to be transferred, is provided.

Further features of the present invention will become apparent from the following description of exemplary embodiments (with reference to the attached drawings).

DESCRIPTION OF THE EMBODIMENTS

Figure 1:
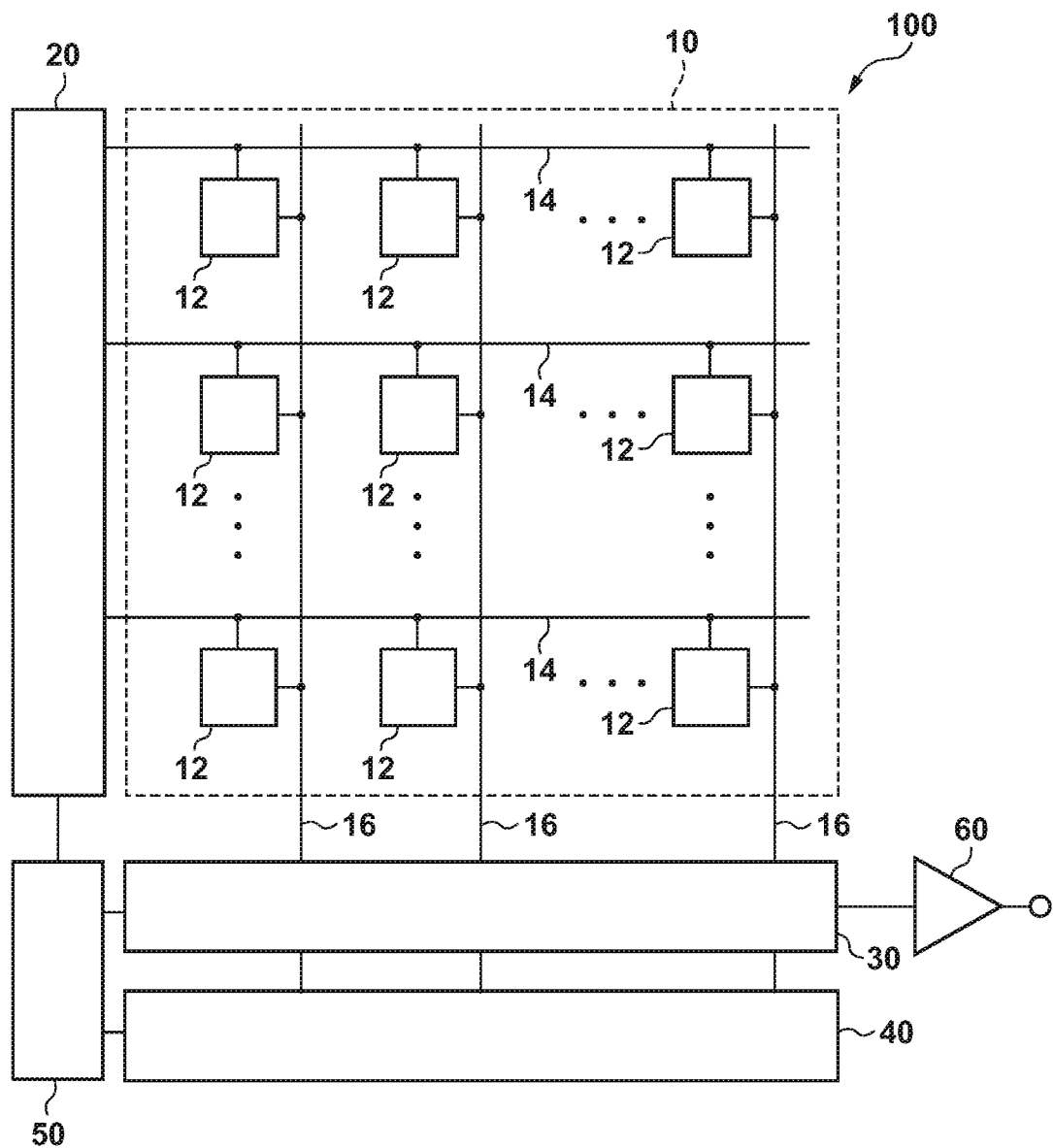
FIG. 1 is a block diagram showing an example of the arrangement of a photoelectric conversion apparatus according to an embodiment of the present invention.

Detailed embodiments of a photoelectric conversion apparatus according to the present invention will now be described with reference to the accompanying drawings. Note that in the following description and drawings, common reference numerals denote common components throughout a plurality of drawings. Hence, the common components will be described by cross-referencing the plurality of drawings, and a description of components denoted by common reference numerals will be appropriately omitted.

The arrangement of a photoelectric conversion apparatus according to the first embodiment of the present invention will be described with reference to FIGS. 1 to 6. FIG. 1 is a block diagram showing an example of the arrangement of a photoelectric conversion apparatus 100 according to this embodiment. The photoelectric conversion apparatus 100 includes, as shown in FIG. 1, a pixel region 10, a vertical scanning circuit 20, a column readout circuit 30, a horizontal scanning circuit 40, a control circuit 50, and an output circuit 60.

A plurality of pixels 12 are arranged in a matrix across a plurality of rows and a plurality of columns in the pixel region 10. In each row of the pixel array of the pixel region 10, a control signal line 14 is arranged so as to extend in the row direction (the horizontal direction in FIG. 1). Each control signal line 14 is connected to the pixels 12 arranged in a corresponding row, and forms a common signal line for the pixels 12 arrayed in the row direction. Also, in each column of the pixel array of the pixel region 10, a vertical output line 16 is arranged so as to extend in the column direction (the vertical direction in FIG. 1). Each vertical output line 16 is connected to the pixels 12 arranged in a corresponding column, and forms a common signal line for the pixels 12 arrayed in the column direction.

The control signal line 14 arranged in each row is connected to the vertical scanning circuit 20. When pixel signals are to be read out from the pixels 12, the vertical scanning circuit 20 supplies a control signal for driving the readout circuits arranged in the respective pixels 12 to the pixels 12 via the corresponding control signal line 14.

One end of the vertical output line 16 arranged in each column is connected to the column readout circuit 30. The pixel signals read out from the pixels 12 are supplied to the column readout circuit 30 via the corresponding vertical output lines 16. The column readout circuit 30 performs predetermined signal processing, for example, signal processing operations such as amplification processing, analog-to-digital conversion processing, and the like on the pixel signal read out from each pixel 12. The column readout circuit 30 can include a differential amplifier circuit, a sample-and-hold circuit, an AD conversion circuit, and the like.

The horizontal scanning circuit 40 supplies, to the column readout circuit 30, a control signal for sequentially transferring the pixel signal of each column processed in the column readout circuit 30 to the output circuit 60. The control circuit 50 supplies a control signal for controlling the operations and the timings of the vertical scanning circuit 20, the column readout circuit 30, and the horizontal scanning circuit 40. The output circuit 60 includes a buffering amplifier, a differential amplifier, and the like, and outputs each pixel signal read out from the column readout circuit 30 to the outside of the photoelectric conversion apparatus 100.

Figure 2:
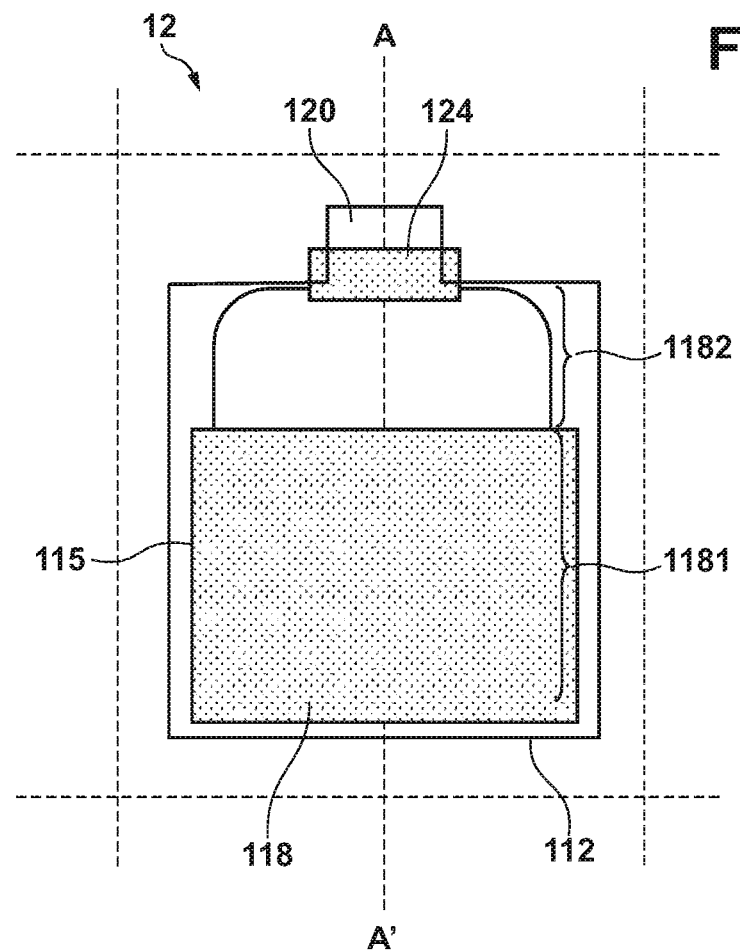
FIG. 2 is a plan view of a pixel of the photoelectric conversion apparatus shown in FIG. 1.
Figure 3:
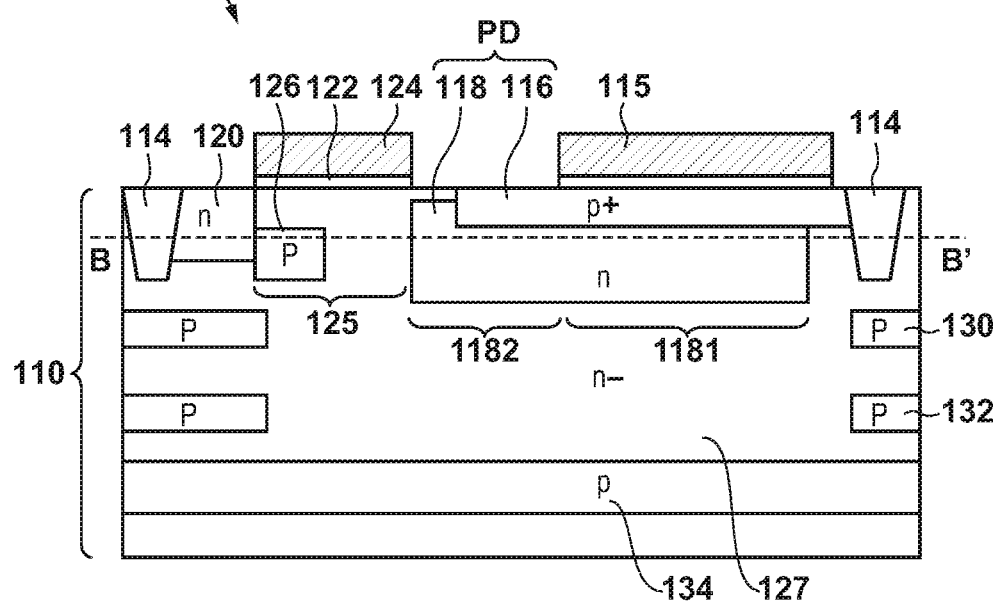
FIG. 3 is a sectional view of the pixel shown in FIG. 2.

FIG. 2 is a view showing a planar layout of each pixel 12 arranged on the pixel region 10 of the photoelectric conversion apparatus 100 according to this embodiment. FIG. 3 is a sectional view of the pixel 12 taken along a line A-A' in FIG. 2. Although FIGS. 2 and 3 show a planar layout of one pixel 12 out of the plurality of pixels 12 arranged in the pixel region 10, the planar layout shown in FIG. 2 can be periodically arranged at a predetermined unit pixel pitch basis in the horizontal directions and the vertical directions in the pixel region 10. The dotted lines shown in FIG. 2 are examples of boundary lines between adjacent pixels 12.

An element isolation insulation region 114 for delimiting an active region 112 of each pixel 12 is arranged in the surface portion of a substrate 110. In the active region 112, a photoelectric conversion portion PD and a floating diffusion (FD) 120 are arranged in an n-type (first conductivity type) region 127 (second region) including a charge transfer portion 125 which is arranged between the photoelectric conversion portion PD and the floating diffusion (FD) 120. The region 127 can be said to be a region close to the surface in the substrate 110. For example, a semiconductor substrate made of silicon or the like can be used for the substrate 110. In this case, the surface of the substrate 110 points to a surface on the "upper" side of the substrate 110 in the sectional view shown in FIG. 3. Additionally, expressions such as "upper" and "lower" used in this specification correspond to the "upper" side and the "lower" side, respectively, of the sectional view as shown in FIG. 3.

The photoelectric conversion portion PD includes an n-type region 118 (first region) arranged in the region 127 of the semiconductor substrate 110 and a p-type (second conductivity type) region 116 (sixth region) which is of a conductivity type opposite to the n-type conductivity type and is arranged on a side closer to the surface of the substrate 110 than the region 118 while in contact with the region 118. The region 118 and the region 116 form an embedded photodiode. The region 118 is a charge accumulation region for accumulating signal charges (electrons) generated in the photoelectric conversion portion PD. In this case, the n-type impurity concentration of the region 127 is lower than the n-type impurity concentration of the region 118.

The FD 120 is an n-type semiconductor region to which the charges generated in the photoelectric conversion portion PD are transferred. The FD 120 is arranged so as to be spaced apart from the n-type region 118 that functions as a charge accumulation region.

The charge transfer portion 125, which is an n-type semiconductor region, is arranged between the photoelectric conversion portion PD and the FD 120. The charge transfer portion 125 can be a part of the region 127 as shown in FIG. 3 or can be a region which is of the same conductivity type as the region 118 and the FD 120, but has a lower impurity concentration than the region 118 and the FD 120. A transfer gate electrode 124 for controlling the transfer of charges from the photoelectric conversion portion PD to the FD 120 is arranged on the charge transfer portion 125. The transfer gate electrode 124 may be made of polysilicon, a metal, a silicide which is a compound of silicon and a metal, or may have a structure formed by stacking these elements. For example, in a case in which the transfer gate electrode 124 is made of polysilicon, p-type polysilicon may be used as the transfer gate electrode 124. Also, a p-type region 126 (third region) in contact with the FD 120, but arranged so to be spaced apart from the region 118 and the surface of the substrate 110 can be provided on the charge transfer portion 125. The region 126 is arranged to electrically isolate the region 118 and the FD 120 more reliably while charges are accumulated in the region 118. The impurity concentration of the region 126 can be lower than the impurity concentration of the region 116.

P-type regions 130, 132, and 134 are arranged at a position deeper, in other words, on a side lower than the region 118 and the FD 120 in the region 127 of the substrate 110. The region 130 electrically isolates, in the substrate 110, the pixels 12 which are adjacent to each other. The region 132 electrically isolates, at a position deeper than the region 130 in the substrate 110, the pixels 12 which are adjacent to each other. The region 134 (fifth region) functions to define the depth to effectively collect the signal charges generated in the substrate 110 by incident light. In an orthogonal projection with respect to the front surface of the substrate 110, the region 134 is arranged so as to entirely overlap the region 118, the region 116, the FD 120, and the charge transfer portion 125. As shown in FIG. 3, in an orthogonal projection with respect to the surface of the substrate 110, the region 134 may be arranged entirely on each pixel 12. The impurity concentration in each of the regions 130, 132, and 134 may be lower than the impurity concentration in the region 116. In this specification, "the orthogonal projection with respect to the surface of the substrate 110" will be indicated as a "planar view". For example, the region 134 described above may be arranged, in the "planar view", throughout the entire pixel of each of the pixels 12.

Each pixel 12 further includes, as shown in FIGS. 2 and 3, a potential control electrode 115 arranged on the photoelectric conversion portion PD so as to control the potential of the region 118. In the planar view, the potential control electrode 115 is arranged at a position which overlaps the region 118 and is spaced apart from the transfer gate electrode 124. That is, in the planar view, the region 118 includes a portion 1181 (first portion) which is covered by the potential control electrode 115 and a portion 1182 (second portion) which is not covered by the potential control electrode 115 and is arranged closer to the side of the charge transfer portion 125 than the portion 1181.

In the planar view, by arranging the transfer gate electrode 124 and the potential control electrode 115 to be spaced apart from each other, the formation of a potential barrier in the charge transfer portion 125 can be suppressed when charges are to be transferred as described above. Also, in the planar view, the potential control electrode 115 may be arranged at a portion where the region 118 and the region 116 overlap. Furthermore, the planar layout of the potential control electrode 115 is not particularly limited to this. For example, as shown in FIG. 2, in the planar view, the potential control electrode 115 may be arranged so as to cross the region 118 from one end of the region 118 to the other end in a direction that intersects with the charge transfer direction.

Figure 4:
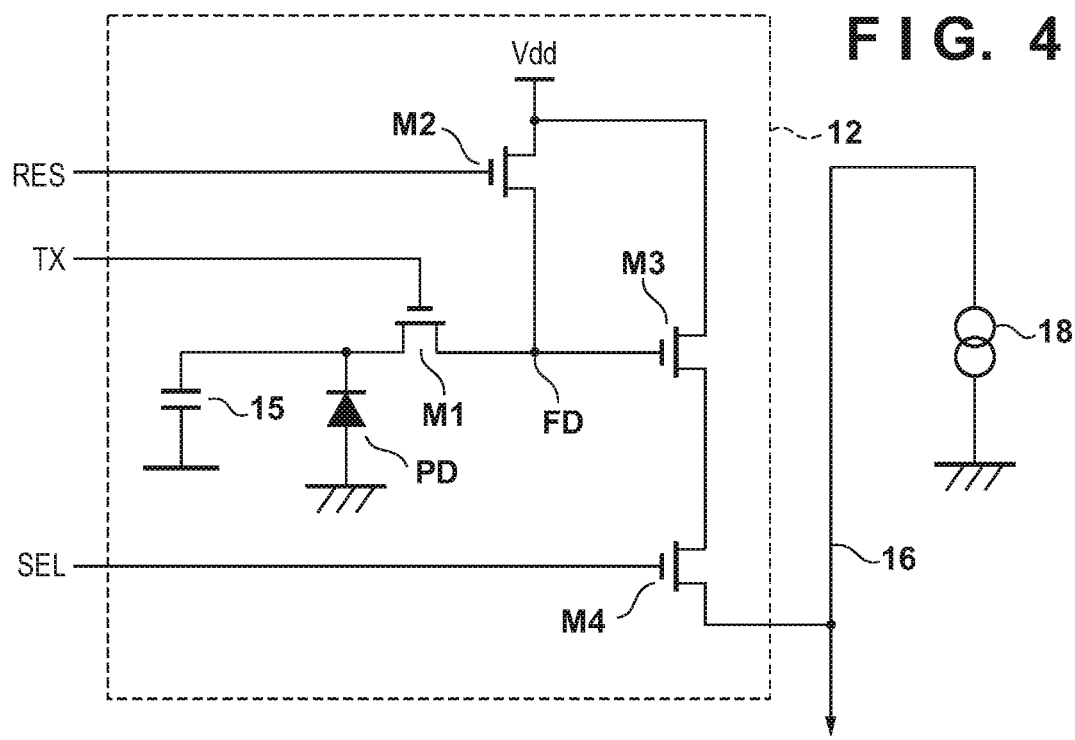
FIG. 4 is an equivalent circuit diagram of the pixel shown in FIG. 2.

Each pixel 12 includes, as shown in FIG. 4, the photoelectric conversion portion PD, a transfer transistor M1, a reset transistor M2, an amplification transistor M3, and a selection transistor M4. The photoelectric conversion portion PD is, for example, a photodiode. The anode of the photoelectric conversion portion PD is connected to a ground voltage line, and the cathode is connected to the source of the transfer transistor M1. The photoelectric conversion portion PD includes the region 118 and the region 116 shown in FIGS. 2 and 3. The drain of the transfer transistor M1 is connected to the source of the reset transistor M2 and the gate of the amplification transistor M3. The source of the transfer transistor M1 is the region 118 shown in FIGS. 2 and 3. The gate electrode of the transfer transistor M1 is the transfer gate electrode 124 shown in FIGS. 2 and 3. A floating diffusion FD, which serves as the drain of the transfer transistor M1, the source of the reset transistor M2, and the gate connection node of the amplification transistor M3, is the FD 120 shown in FIGS. 2 and 3, and the capacitance component included in this node forms a charge voltage conversion portion. The drain of the reset transistor M2 and the drain of amplification transistor M3 are connected to a power supply voltage Vdd. The source of the amplification transistor M3 is connected to the drain of the selection transistor M4. The source of the selection transistor M4 is connected to the corresponding vertical output line 16. A current source 18 is connected to the other end of the vertical output line 16.

In the case of the circuit arrangement shown in FIG. 4, the control signal line 14 includes a transfer gate signal line TX, a reset signal line RES, and a selection signal line SEL. The transfer gate signal line TX is connected to the gate electrode of the transfer transistor M1. The reset signal line RES is connected to the gate electrode of the reset transistor M2. The selection signal line SEL is connected to the gate electrode of the selection transistor M4.

The photoelectric conversion portion PD converts (photoelectrically converts) incident light into charges of an amount corresponding to the incident light amount, and accumulates the generated charges in the region 118. In the arrangement shown in FIG. 4, a capacitor 15 corresponding to the above-described potential control electrode 115 is connected to the photoelectric conversion portion PD, and the capacitor 15 is represented as an element for changing the capacitance inside the photoelectric conversion portion PD. The transfer transistor M1 transfers the charges of the photoelectric conversion portion PD to the floating diffusion FD by making an ON operation (becoming conductive). The voltage of the floating diffusion FD is the voltage corresponding to the amount of charges transferred from the photoelectric conversion portion PD upon undergoing charge-voltage conversion by the capacitor of the photoelectric conversion portion PD. The amplification transistor M3 has an arrangement in which the power supply voltage Vdd is supplied to the drain and a bias current is supplied from the current source 18 to the source via the selection transistor M4. The amplification transistor M3 forms an amplification portion (source-follower circuit) in which the gate serves as an input node. As a result, the amplification transistor M3 outputs a signal, based on the voltage of the floating diffusion FD, to the vertical output line 16 via the selection transistor M4. The reset transistor M2 performs an ON operation to reset the voltage of the floating diffusion FD into a voltage corresponding to the power supply voltage Vdd.

Figure 5:
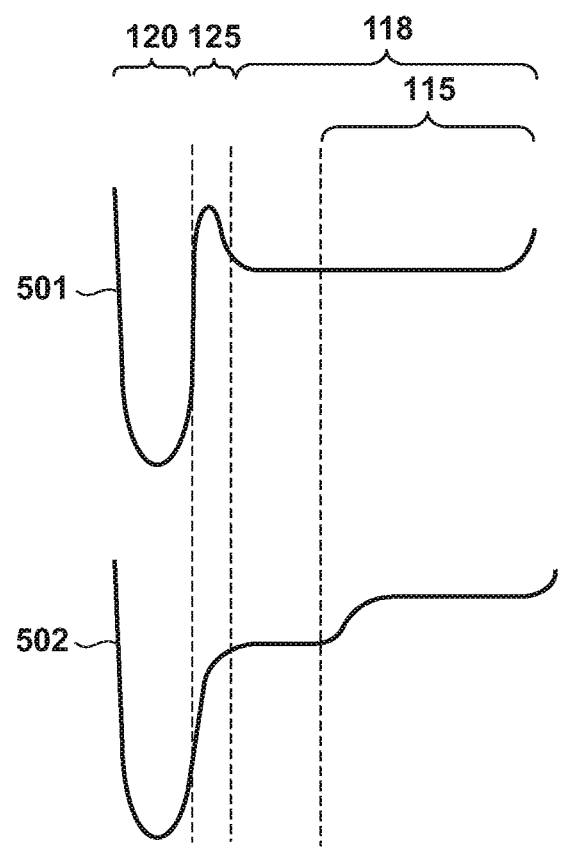
FIG. 5 is a potential chart of the pixel shown in FIG. 2.
Figure 6:
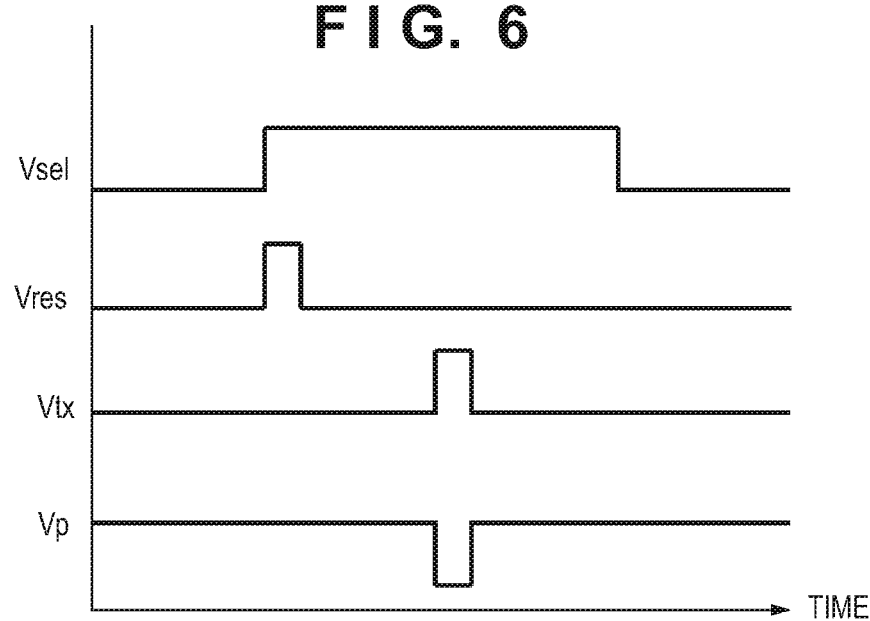
FIG. 6 is a timing chart obtained at the time of a readout operation of the photoelectric conversion apparatus shown in FIG. 1.

A charge readout operation and charge sweeping operation according to this embodiment will be described next. FIG. 5 is a chart showing a potential distribution of a portion from the photoelectric conversion portion PD (region 118) to the floating diffusion FD (FD 120) via the charge transfer portion 125. FIG. 6 is a clock timing chart at the time of a charge readout operation. This timing chart shows driving voltages Vsel, Vres, Vtx, and Vp of the selection signal line SEL, the reset signal line RES, and the transfer gate signal line TX shown in FIG. 4, and the potential control electrode 115 shown in FIGS. 2 and 3, respectively.

At the time of a charge accumulation operation indicated by a line 501 in FIG. 5, charges will be sufficiently accumulated by making the potential of the region 118, serving as the charge accumulation region, deeper than the potential of the charge transfer portion 125 without applying a voltage on the potential control electrode 115. This sufficient accumulation of charges can increase the saturated charge amount and the blooming margin of the photoelectric conversion portion PD.

On the other hand, at the time of a charge readout operation indicated by a line 502 in FIG. 5, a voltage which is set in the negative direction during the charge accumulation operation is applied from the potential control electrode 115 to the photoelectric conversion portion PD in synchronization with an application pulse of the readout voltage (the driving voltage Vtx). More specifically, as shown in FIG. 6, the potential of the region 118 is reduced by applying, to the potential control electrode 115, a voltage (the driving voltage Vp) which is set in the negative direction during the charge accumulation together with the generation of the pulse of the driving voltage Vtx. As a result, the potential of the region 118 will be shallow at the time of the charge readout operation, thus improving the readout transfer characteristic of reading out charges accumulated in the region 118 to the FD 120.

A case in which the potential control electrode 115 is arranged to overlap the charge transfer portion 125 will be considered. When charges are to be transferred from the region 118 to the FD 120, a voltage (the driving voltage Vtx) in the positive direction is applied, as shown in FIG. 6, to the transfer gate electrode 124 arranged on the charge transfer portion 125 so as to form a channel in the charge transfer portion 125. On the other hand, as described above, a voltage (the driving voltage Vp) set in the negative direction is applied to the potential control electrode 115. Hence, a potential barrier may be formed in the vicinity of the boundary between the region 118 and the charge transfer portion 125 due to the voltage applied from the potential control electrode 115.

On the other hand, as shown in FIGS. 2 and 3, the potential control electrode 115 is arranged spaced apart from the transfer gate electrode 124. Thus, a region with a shallow potential due to the potential control electrode 115 will be formed in a region apart from the charge transfer portion 125 of the region 118. Hence, it is possible to suppress the formation of a potential barrier in the vicinity of the boundary between the region 118 and the charge transfer portion 125. Also, in this case, as indicated by the line 502, a potential slope formed in the region 118 will become a slope which will facilitate the movement of the charges from the region 118 to the charge transfer portion 125. In this manner, both a large saturated charge amount and a high charge transfer performance can be achieved by the arrangement shown in this embodiment. As a result, the high-performance photoelectric conversion apparatus 100 that has a stably large saturated signal amount and sufficient transfer characteristics can be implemented.

Additionally, in this embodiment, although the regions 118, 120, and 127 were described to be n-type semiconductor regions and the regions 116, 126, 130, 132, and 134 to be p-type semiconductor regions, this arrangement of the semiconductor regions may be reversed. In a case in which the conductivity types of the respective regions have been reversed, the polarities of the voltages to be applied to the potential control electrode 115 and the transfer gate electrode 124 in the respective operations can be reverse of those in the above description. That is, when charges are to be transferred, a voltage of a direction in which the potential increases with respect to the charges to be transferred may be applied to the potential control electrode 115.

Figure 7:
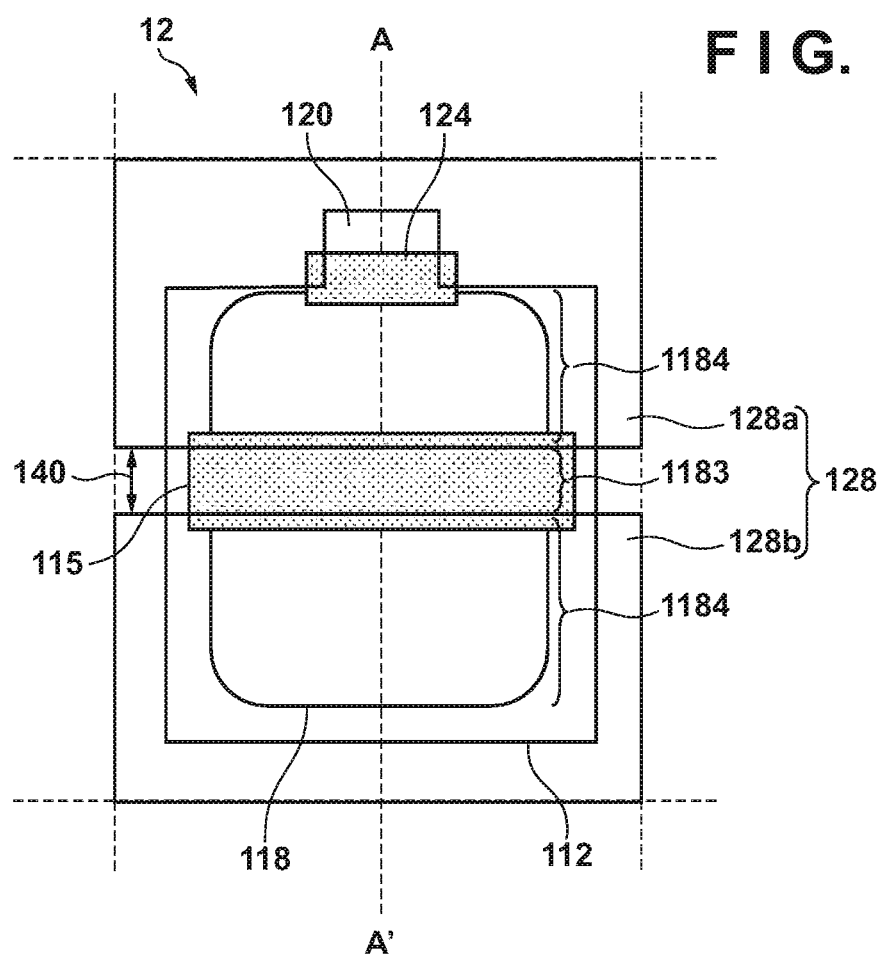
FIG. 7 is a plan view of a pixel of a photoelectric conversion apparatus shown in FIG. 1.
Figure 8:
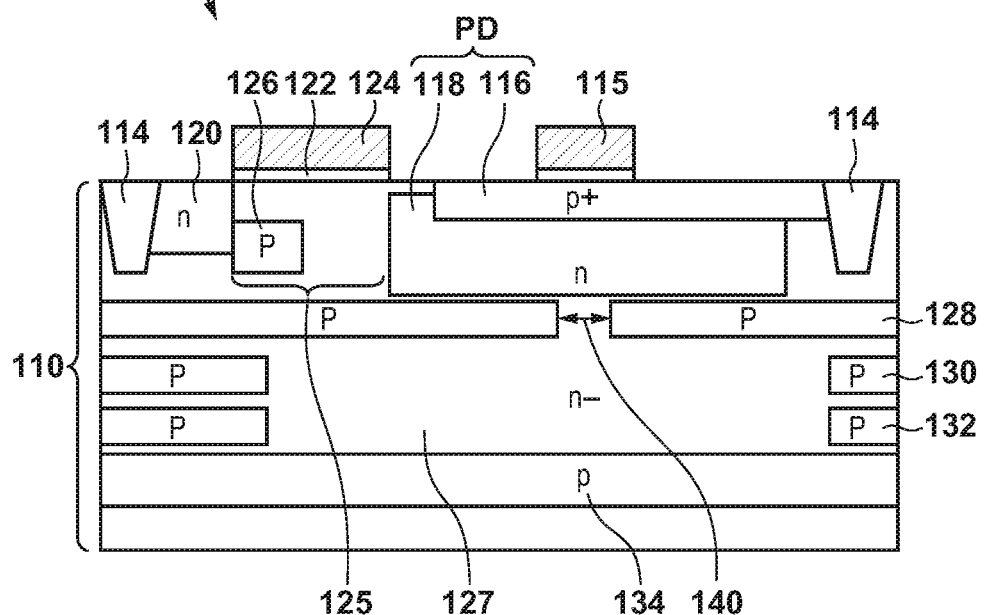
FIG. 8 is a sectional view of the pixel shown in FIG. 7.

A photoelectric conversion apparatus according to the second embodiment of the present invention will be described with reference to FIGS. 7 to 9. FIG. 7 is a view showing the planar layout of each pixel 12 arranged in a pixel region 10 according to a photoelectric conversion apparatus 100. FIG. 8 is a sectional view of the pixel 12 taken along a line A-A' in FIG. 7. In a manner similar to FIGS. 2 and 3 described above, FIGS. 7 and 8 show one pixel 12 out of the plurality of pixels 12 arranged on the pixel region 10. As shown in FIGS. 7 and 8, compared to the first embodiment described above, a p-type region 128 has been added and the shape of a potential control electrode 115 is different in the pixel 12 according to this embodiment. Since the arrangements of components other than these may be similar to those in the first embodiment described above, a description will be omitted here.

In this embodiment, as shown in FIGS. 7 and 8, the p-type region 128 (fourth region) is arranged at a position deeper than the positions of a region 118 and a FD 120 of a region 127. In the planar view, the region 128 is arranged so as to entirely overlap the FD 120 and a charge transfer portion 125 and to partially overlap the region 118. In this case, as shown in FIG. 7, in the planar view, the region 118 includes a portion 1184 which overlaps the region 128 and a portion 1183 (third portion) which does not overlap the region 128. Also, as shown in FIGS. 7 and 8, a portion arranged below the portion 1183 of the region 127 at the depth where the region 128 is arranged will be referred to as a gap 140.

In the first embodiment described above, a depletion layer spreads below the region 118. In contrast, in this embodiment, in the lower portion of the region 118, the region 128 is arranged as a depletion suppression layer to suppress the depletion layer from spreading below the region 118. As shown in FIG. 7, in the planar view, the region 128 may be arranged on the entire portion of each pixel 12 excluding the portion of the gap 140.

In the planar view, the region where the region 118 and the gap 140 overlap, that is, the portion 1183 which is a portion that does not overlap the region 128 in the region 118 may be arranged at a portion, at which the potential becomes highest in the region 118, which is typically the center portion of the region 118. In the planar view, although the layout of the portion 1183 (gap 140) is not particularly limited, the layout may be, for example, an almost rectangular region arranged at the center portion of the region 118.

Also, for example, the layout of the portion 1183 (gap 140) may be arranged so as to cross the region 118 as shown in FIG. 3. In other words, in the planar view, the portion 1183 may be arranged at the center portion of the region 118 in the charge transfer direction and arranged so as to cross the region 118 from one end of the region 118 to the other end in a direction that intersects with the charge transfer direction. In this case, as shown in FIG. 7, in the planar view, it can be said that the region 128 includes two regions, a region 128a and a region 128b, which are spaced apart from each other. In the arrangement shown in FIGS. 7 and 8, a region arranged on the side of a transfer gate electrode 124 in the region 128 will be referred to as the region 128a. In this case, the center portion of the region 118 can be a region on the inner side of a line connecting the halfway point of a straight line connecting the sides from the geometric center of gravity of the region. Also, the center portion of the region 118 in the charge transfer direction can be the two center regions among the regions obtained by quartering the region 118 in the charge transfer direction.

As shown in FIG. 8, p-type regions 130, 132, and 134 are arranged at a position deeper than the region 128 in the region 127 of the substrate 110. Hence, the region 128 can be said to be a region which is arranged between the photoelectric conversion portion PD including the region 118 and a region 116 and a depth effective in collecting signal charges generated in a substrate 110 by incident light defined by the region 134.

By arranging the region 128 below the region 118, a p-n junction capacitance is formed between the n-type region 118 and the p-type region 128. As is obvious from the relation expressed as charges Q=capacitance C×voltage V, in a case in which the predetermined reverse bias voltage V is applied to the p-n junction of the photoelectric conversion portion PD, the accumulated charge amount Q will increase as the p-n junction capacitance C becomes larger. Although the signal charges accumulated in the region 118 are transferred to the FD 120, the transfer of the signal charges of the region 118 will stop when the potential of the region 118 reaches a predetermined potential which is determined by the power supply voltage or the like. That is, since the fluctuation amount of the voltage V accompanying the transfer of signal charges is determined, the saturated charge amount will increase proportionally to the p-n junction capacitance of the photoelectric conversion portion PD. Hence, by arranging the region 128, the saturated charge amount of the region 118 as a charge accumulation layer can be increased.

The gap 140 between the region 128a and the region 128b becomes the signal charge movement path when signal charges generated between the region 128 and the region 134 in the region 127 of the substrate 110 are to be collected to the region 118. Hence, the signal charges generated between the region 128 and the region 134 in the region 127 can be collected quickly to the region 118 by suitably setting the shape and the size of the gap 140 and the impurity concentration of the p-type region 128. That is, by arranging the gap 140, the pixel 12 can obtain a sensitivity equal to that of a structure without the region 128 even in a case in which the region 128 is arranged.

Figure 9:
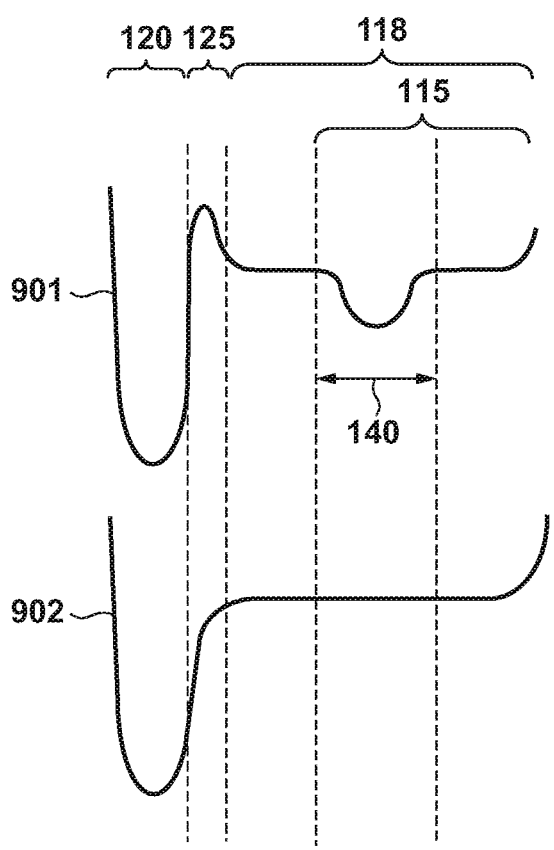
FIG. 9 is a potential chart of the pixel shown in FIG. 7.

FIG. 9 is a chart showing the potential distribution of a portion from the region 118 to the FD 120 via the charge transfer portion 125. When the gap 140 of the region 128 is arranged below the region 118, a comparatively large depression in the potential is generated in the photoelectric conversion portion PD (region 118), and this may degrade the transfer performance. This depression in the potential is generated, as indicated by a line 901 in FIG. 9, in correspondence with the arrangement portion of the gap 140 at which the region 128 is not arranged. This is because it is more difficult for the portion 1184 of the region 118 to be depleted than the portion 1183 with respect to the same potential. Signal charges tend to accumulate in such a depression in the potential, and is expressed as transfer performance degradation at the time of a charge transfer operation.

Thus, in the planar view, the potential control electrode 115 may be arranged so as to overlap at least the portion 1183 which does not overlap the region 128 of the region 118. When charges are to be transferred from the region 118 to the FD 120, a voltage which is set in the negative direction during the charge accumulation operation is applied to the potential control electrode 115. Hence, as indicated by a line 902 in FIG. 9, it will be possible to reduce the depression in the potential in the region 118 of a portion where the gap 140 has been provided. As a result, when charges are to be transferred from the region 118 to the FD 120, the transfer performance can be improved by suppressing the accumulation of signal charges in the depression in the potential.

At the time of a charge accumulation operation expressed by the line 901 in FIG. 9, charges are sufficiently accumulated, without applying a voltage to the potential control electrode 115, by setting the potential of the region 118 to be deeper than the potential of the charge transfer portion 125. At this time, a larger amount of charges can be accumulated by using the large depression in the potential in the portion 1183 generated in correspondence with the portion at which the gap 140 has been arranged. The saturated charge amount and the blooming margin of the photoelectric conversion portion PD can be increased by this sufficient accumulation of charges.

On the other hand, at the time of a charge readout operation expressed by the line 902 in FIG. 9, the potential of the region 118 is reduced by synchronizing with the application pulse of a readout voltage (a driving voltage Vtx) and applying, to the potential control electrode 115, a voltage which is set in the negative direction during the charge accumulation operation. This will make the potential of the portion 1183 in the region 118 shallow at the time of a readout operation and will reduce the depression in the potential. As a result, the transfer performance can be improved by suppressing the accumulation of signal charges in the depression in the potential.

In this manner, both a large saturated charge amount and a high charge transfer performance can be achieved by the arrangement shown in this embodiment in a similar manner to the first embodiment described above. As a result, a high-performance photoelectric conversion apparatus that has a stably large saturated signal amount and sufficient transfer characteristics can be implemented.

Figure 10:
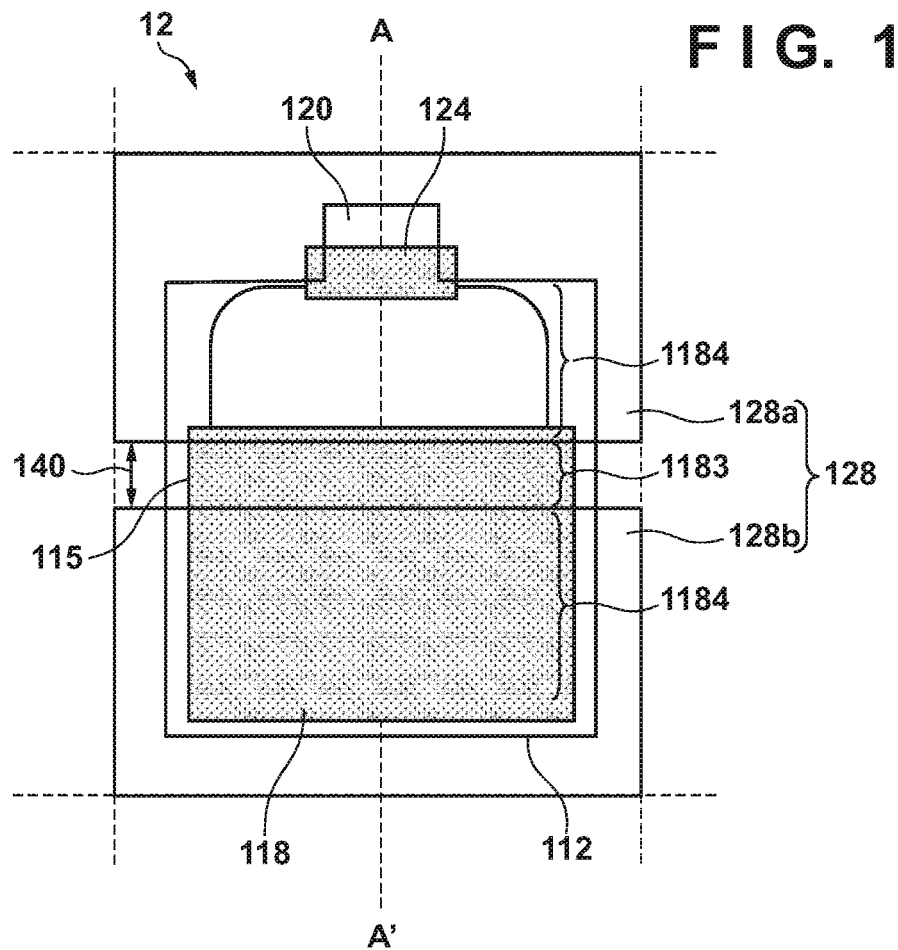
FIG. 10 is a plan view of a pixel of a photoelectric conversion apparatus shown in FIG. 1.
Figure 11:
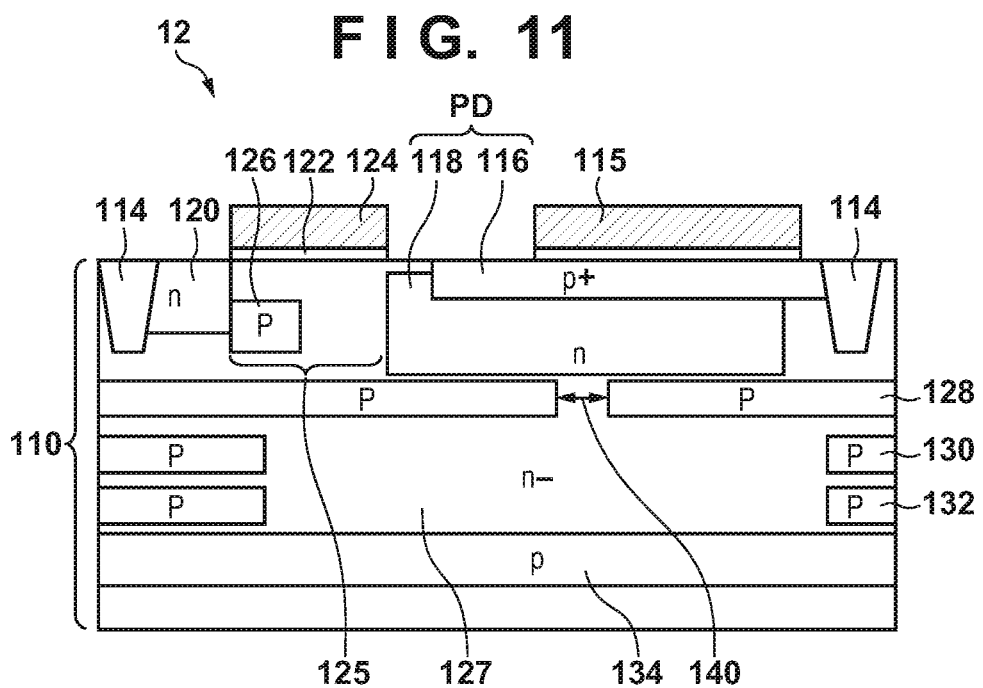
FIG. 11 is a sectional view of the pixel shown in FIG. 10.

A photoelectric conversion apparatus according to the third embodiment of the present invention will be described with reference to FIGS. 10 to 12. FIG. 10 is a view showing the planar layout of each pixel 12 arranged in a pixel region 10 according to a photoelectric conversion apparatus 100. FIG. 11 is a sectional view of the pixel 12 taken along a line A-A' in FIG. 10. In a manner similar to FIGS. 7 and 8 described above, FIGS. 10 and 11 show one pixel 12 out of the plurality of pixels 12 arranged on the pixel region 10. As shown in FIGS. 10 and 11, compared to the second embodiment described above, the shape of a potential control electrode 115 in the pixel 12 according to this embodiment is different from that of the second embodiment. Since the arrangements of components other than these may be similar to those in the second embodiment described above, a description will be omitted here.

In the second embodiment described above, the potential control electrode 115 is arranged in the center portion of a region 118 in the charge transfer direction. On the other hand, in this third embodiment, the potential control electrode 115 has two end portions in the charge transfer direction. One end portion (first end portion) is arranged at a position that overlaps the region 118 which is spaced apart from a transfer gate electrode 124. Also, in a manner similar to the first embodiment described above, the other end portion (second end portion) is arranged at a position that is farther away from the transfer gate electrode 124 than the end portion on the opposite side of the transfer gate electrode 124 in the region 118. Alternatively, the other end portion may be arranged at a position that overlaps the end portion on the opposite side of the transfer gate electrode 124 in the region 118.

Figure 12:
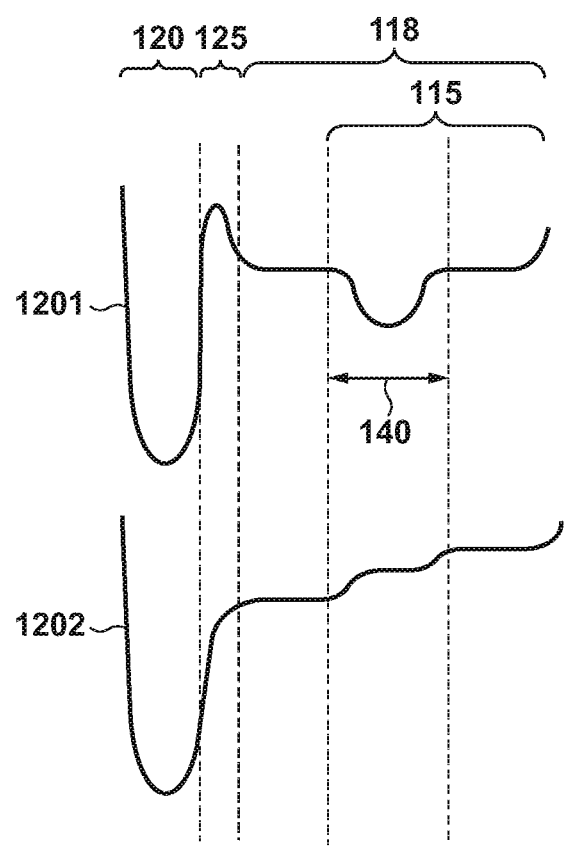
FIG. 12 is a potential chart of the pixel shown in FIG. 10.

FIG. 12 is a view showing the potential distribution of a portion from the region 118 to an FD 120 via a charge transfer portion 125. As indicated by a line 1202 in FIG. 12, a voltage which is set in the negative direction during the charge accumulation operation is applied to the potential control electrode 115 when charges are to be transferred from the region 118 to the FD 120. This can reduce, in a manner similar to the second embodiment described above, the depression in the potential in the region 118 in a portion where a gap 140 has been provided. Also, the depth of the potential in the region 118 in a portion where a region 128b has been arranged in the region 118 is reduced simultaneously. Accordingly, the potential of the region 118 at the time of a charge transfer operation will deepen sequentially from the upper portion of a region 128a which is close to the charge transfer portion 125, the upper portion of the gap 140, and the upper portion of the region 128b, as indicated by the line 1202 in FIG. 12. As a result, a potential slope which will facilitate the movement of charges to the charge transfer portion 125 is formed in the region 118. This will further improve the transfer performance by suppressing the accumulation of signal charges in the depression the potential.

At the time of a charge accumulation operation expressed by a line 1201 in FIG. 12, charges are sufficiently accumulated, without applying a voltage to the potential control electrode 115, by setting the potential of the region 118 to be deeper than the potential of the charge transfer portion 125. At this time, a larger amount of charges can be accumulated by using the large depression in the potential in a portion 1183 generated in correspondence with the portion at which the gap 140 has been arranged. The saturated charge amount and the blooming margin of a photoelectric conversion portion PD can be increased by this sufficient accumulation of charges.

On the other hand, at the time of a charge readout operation expressed by a line 1202 in FIG. 12, the depth of the potential of the region 118 is reduced by synchronizing with the application pulse of a readout voltage (a driving voltage Vtx) and applying, to the potential control electrode 115, a voltage which is set in the negative direction during the charge accumulation operation. This will reduce the potential in the region 118 at the time of a readout operation and further form, in the region 118, a potential slope which will facilitate the movement of charges in the direction of the charge transfer portion 125 as described above. As a result, the transfer performance can be further improved by suppressing the accumulation of signal charges in the depression in the potential.

In this manner, both a large saturated charge amount and a high charge transfer performance can be achieved by the arrangement shown in this embodiment in a manner similar to the first and second embodiments described above. As a result, a high-performance photoelectric conversion apparatus that has a stably large saturated signal amount and sufficient transfer characteristics can be implemented.

Other Embodiments

The embodiments described above can be applied to not only a front irradiation type photoelectric conversion apparatus, but also a back irradiation type photoelectric conversion apparatus.

In addition, a potential control electrode 115 may be set to have a negative voltage at the time of a charge accumulation operation. Setting the potential control electrode 115 to have a negative voltage will excite holes on the surface of a substrate 110, and allow electrons to disappear by recombination even when the electrons which are dark current components are generated. As a result, the dark current components can be suppressed. In this case, a p-type region 116 that forms an embedded photodiode need not be arranged. To further suppress the dark current, the potential control electrode 115 may be arranged in the planar view so as to occupy an area larger than that for the potential control electrode 115 shown in FIG. 3. For example, the entire region 116 may be covered by the potential control electrode 115. The photoelectric conversion efficiency of incident light may decrease if the area of the potential control electrode 115 is increased in a front irradiation type photoelectric conversion apparatus. Thus, such a form may be used in a back irradiation type photoelectric conversion apparatus.

A camera incorporating a photoelectric conversion apparatus will be exemplified as an application example of the photoelectric conversion apparatus according to each embodiment described above hereinafter. The concept of a camera includes, not only an apparatus whose main purpose is image capturing but also an apparatus (for example, a personal computer or a mobile terminal) that supplementarily has an image capturing function. The camera includes a photoelectric conversion apparatus exemplified in each embodiment described above, and a signal processing unit that processes information based on a signal output from the photoelectric conversion apparatus. The signal processing unit can include a processor that processes digital data as image data. The processor can calculate a defocusing amount based on a signal from each pixel that has a focus detection function of the photoelectric conversion apparatus, and perform processing to control the focus adjustment of an image capturing lens. An A/D converter that generates the image data described may be included in the photoelectric conversion apparatus or may be arranged separately from the photoelectric conversion apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-001378, filed Jan. 8, 2019 which is hereby incorporated by reference herein in its entirety.

What is claimed is:

1. A photoelectric conversion apparatus comprising:
   a photoelectric conversion portion including a first region of a first conductivity type;
   a floating diffusion of the first conductivity type to which charges generated in the photoelectric conversion portion are transferred;
   a charge transfer portion arranged between the photoelectric conversion portion and the floating diffusion, wherein the photoelectric conversion portion, the floating diffusion and the charge transfer portion are arranged in a substrate having a surface;
   a transfer gate electrode arranged on the charge transfer portion; and
   a potential control electrode arranged on the photoelectric conversion portion to control a potential in the first region,
   wherein a voltage set in a direction in which the potential will increase with respect to the charges is applied to the potential control electrode when charges are to be transferred,
   in an orthogonal projection with respect to the surface of the substrate,
   the potential control electrode has a first end portion and a second end portion in a charge transfer direction, the first end portion being arranged between the transfer gate electrode and the second end portion,
   the first end portion is arranged at a position that overlaps the first region and is spaced apart from the transfer gate electrode, and
   the second end portion is arranged at one of: (i) a position that overlaps an end portion the first region which is the farthest from the floating diffusion in the first region, and (ii) a position farther away from the transfer gate electrode than the end portion of the first region.

2. The apparatus according to claim 1, wherein the first region further includes a portion covered by the potential control electrode.

3. The apparatus according to claim 1, wherein in the orthogonal projection with respect to the surface of the substrate, the potential control electrode is arranged so as to cross the first region from one end of the first region to the other end of the first region in a direction that intersects with a charge transfer direction.

4. The apparatus according to claim 1, wherein the photoelectric conversion portion further includes a sixth region of a conductivity type opposite to the first conductivity type, the sixth region being arranged between the first region and the surface of the substrate.

5. The apparatus according to claim 4, wherein in the orthogonal projection with respect to the surface of the substrate, the potential control electrode is arranged in a portion where the first region and the sixth region overlap.

6. The apparatus according to claim 1, wherein the first conductivity is an n-type conductivity, and
   a negative voltage is applied to the potential control electrode when the charges are to be transferred.

7. A camera comprising:
   a photoelectric conversion apparatus according to claim 1; and
   a signal processing portion configured to process a signal obtained by the photoelectric conversion apparatus.

8. A photoelectric conversion apparatus comprising:
   a photoelectric conversion portion including a first region of a first conductivity type;
   a floating diffusion of the first conductivity type to which charges generated in the photoelectric conversion portion are transferred;
   a charge transfer portion arranged between the photoelectric conversion portion and the floating diffusion, wherein the photoelectric conversion portion, the floating diffusion and the charge transfer portion are arranged in a substrate having a surface;

a transfer gate electrode arranged on the charge transfer portion; and a potential control electrode arranged on the photoelectric conversion portion to control a potential in the first region, wherein a voltage set in a direction in which the potential will increase with respect to the charges is applied to the potential control electrode when charges are to be transferred, the first region and the floating diffusion are arranged in a second region of the first conductivity type including the charge transfer portion, and an impurity concentration of the second region is lower than an impurity concentration of the first region.

9. The apparatus according to claim 8, wherein a third region of a conductivity type opposite to the first conductivity type is arranged to be in contact with the floating diffusion and to be spaced apart from the first region and the surface of the substrate.

10. The apparatus according to claim 8, wherein a fourth region of a conductivity type opposite to the first conductivity type is arranged at a position deeper than the first region and the floating diffusion in the second region, and
in the orthogonal projection with respect to the surface of the substrate,
the fourth region is arranged so as to entirely overlap the floating diffusion and the charge transfer portion and to partially overlap the first region, and
the potential control electrode is arranged so as to overlap at least a third portion, which does not overlap the fourth region, in the first region.

11. The apparatus according to claim 10, wherein in the orthogonal projection with respect to the surface of the substrate, the third portion is arranged at a center portion of the first region.

12. The apparatus according to claim 10, wherein in the orthogonal projection with respect to the surface of the substrate, the third portion is arranged so as to be at the center in a charge transfer direction of the first region, and to cross the first region from one end of the first region to the other end in a direction that intersects with the charge transfer direction.

13. The apparatus according to claim 10, wherein a fifth region of a conductivity type opposite to the first conductivity type is arranged at a position deeper than the fourth region in the second region, and
in the orthogonal projection with respect to the surface of the substrate, the fifth region is arranged so as to entirely overlap the first region, the floating diffusion, and the charge transfer portion.

14. The apparatus according to claim 8, wherein a fifth region of a conductivity type opposite to the first conductivity type is arranged at a position deeper than the first region and the floating diffusion in the second region, and
in the orthogonal projection with respect to the surface of the substrate, the fifth region is arranged so as to entirely overlap the first region, the floating diffusion, and the charge transfer portion.

15. A photoelectric conversion apparatus comprising:
a photoelectric conversion portion including a first region of a first conductivity type;
a floating diffusion of the first conductivity type to which charges generated in the photoelectric conversion portion are transferred;
a charge transfer portion arranged between the photoelectric conversion portion and the floating diffusion, wherein the photoelectric conversion portion, the floating diffusion and the charge transfer portion are arranged in a substrate having a surface;
a transfer gate electrode arranged on the charge transfer portion; and
a potential control electrode arranged on the photoelectric conversion portion to control a potential in the first region,
wherein charges in the photoelectric conversion portion are transferred from the photoelectric conversion portion to the floating diffusion when a voltage to form a channel in the charge transfer portion is applied to the transfer gate electrode,
a voltage set in a direction in which the potential will increase with respect to the charges is applied to the potential control electrode when charges are to be transferred,
in the orthogonal projection with respect to the surface of the substrate, the potential control electrode has a first end portion and a second end portion in a charge transfer direction, the first end portion being arranged between the transfer gate electrode and the second end portion,
the first end portion is arranged at a position that overlaps the first region and is spaced apart from the transfer gate electrode, and
the second end portion is arranged at one of: (i) a position that overlaps an end portion the first region which is the farthest from the floating diffusion in the first region, and (ii) a position farther away from the transfer gate electrode than the end portion of the first region.

16. A camera comprising:
a photoelectric conversion apparatus according to claim 15; and
a signal processing portion configured to process a signal obtained by the photoelectric conversion apparatus.

* * * * *